(12) United States Patent
Su et al.

(10) Patent No.: US 6,570,453 B2
(45) Date of Patent: May 27, 2003

(54) SYNTHESIZER WITH LOCK DETECTOR, LOCK ALGORITHM, EXTENDED RANGE VCO, AND A SIMPLIFIED DUAL MODULUS DIVIDER

(75) Inventors: David K. Su, Mountain View, CA (US); Chik Patrick Yue, Milpitas, CA (US); David J. Weber, Sunnyvale, CA (US); Masound Zargari, Mountain View, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 10/099,229

(22) Filed: Mar. 13, 2002

(65) Prior Publication Data

US 2002/0101288 A1 Aug. 1, 2002

Related U.S. Application Data

(62) Division of application No. 09/747,778, filed on Dec. 22, 2000, now Pat. No. 6,404,289.

(51) Int. Cl.[7] ................................................ H03L 7/00
(52) U.S. Cl. ...................................................... 331/1 A
(58) Field of Search ........................... 331/1 A, 17, 25, 331/DIG. 2, 10, 11, 14, 18; 327/156–159; 360/51; 375/376; 455/260; 332/127

(56) References Cited

U.S. PATENT DOCUMENTS

4,473,805 A * 9/1984 Guhn ........................... 331/1 A
6,114,920 A   9/2000 Moon et al. ................. 331/179

* cited by examiner

*Primary Examiner*—David C. Mis
(74) *Attorney, Agent, or Firm*—Pillsbury Winthrop LLP

(57) ABSTRACT

The present invention provides a synthesizer having an efficient lock detect signal generator, an extended range VCO that can operate within any one of a plurality of adjacent characteristic curves defined by a plurality of adjacent regions, and a divide circuit implemented using only a single counter along with a decoder. This allows for a method of operating the synthesizer, methods of establishing or reestablishing a lock condition using the extended range VCO, and a method of designing a plurality of divide circuits which each use the same single counter and each use a different decoder.

14 Claims, 12 Drawing Sheets

SYNTHESIZER WITH LOCK DETECTOR, LOCK ALGORITHM, EXTENDED RANGE VCO, AND A SIMPLIFIED DUAL MODULUS DIVIDER

This application is a division of application Ser. No. 09/747,778, filed Dec. 22, 2000, now U.S. Pat. No. 6,404,289.

FIELD OF THE ART

The present invention relates to a synthesizer, and in particular a synthesizer with a lock detector, a lock algorithm, an extended range voltage controlled oscillator, and a simplified dual modulus divider.

BACKGROUND DESCRIPTION OF THE RELATED ART

Synthesizers are used in communication devices to obtain an output signal that is synchronized with some other signal, such as reference signal. Certain synthesizers use what is known as phase locked loop (PLL) with a voltage controlled oscillator (VCO) to cause the output signal frequency to vary in dependence upon the input control voltage. FIG. 1A illustrates a simple graph that shows that a desired output frequency can be caused to vary in linear dependence upon some control voltage Vc. As shown in this example, the output frequency has a range that varies by 100 MHz as the control voltage changes from 1.0 volts to 2.2 volts. Further, far from being ideal, there is typically only a narrow range A where the response is linear, with the response at each end of this range becoming increasingly nonlinear.

A PLL circuit 200 that uses a VCO to generate an output signal that is synchronized to a reference signal is illustrated in FIG. 2. PLL 200 includes a phase detector 220, a filter 230, a VCO 240, and a divide-by-N circuit 250. In operation, if the output of the VCO 240 is synchronized with the reference signal REF, then the signal generated by the divide-by-N circuit 250 will be in phase with the reference signal REF, thereby causing the output of the phase detector 220 to remain constant. As a result, since the output signal is synchronized with the reference signal (known as a "lock" condition) the control voltage Vc that is input to the VCO 240 will remain the same. If, however, the output of the VCO is not in phase with the reference signal REF (known as a "out of lock" condition), the phase detector 220 will detect the amount that the VCO output is out of phase. The amount that the VCO output is out of phase will be used to correspondingly change the control voltage Vc, thereby causing the frequency of the signal output of the VCO to again become synchronized with the reference signal REF.

While the PLL circuit as described above is capable of automatically adjusting back to a lock condition, it is desirable to know whether the PLL circuit is in the lock condition or the out of lock condition at any moment in time. Accordingly, lock detectors are known that use the state of the PLL signals to indicate the presence or absence of a lock condition.

In many such conventional circuits, the phase detector, such as the phase detector 220 in FIG. 2, used can output both an "UP" signal and a "DN" (down) signal. If the PLL becomes out of lock, the UP and DN signals will no longer be balanced. Thus, if such a phase detector is used, complicated circuits that use both the UP and DN commands in order to determine if the PLL is in a lock condition or an out of lock condition are known. U.S. Pat. Nos. 5,969,576 and 5,126,690 are examples of such conventional circuits.

Nonetheless, a simplified lock detector circuit that can be easily implemented in digital logic and whose operation is independent from carrier frequency is desirable. The present invention, described hereinafter, provides such a circuit.

Furthermore, while FIG. 1A above illustrates the region in which the VCO will operate in terms of the relationship between the control voltage and the output frequency of a VCO that can be represented as a single characteristic curve, an extended range VCO can be configured to output different output frequencies for the same control voltage value, thus allowing the extended range VCO to operate in various regions. Each different region of operation can be achieved by changing the capacitive load associated with the extended range VCO, and thus obtaining a different characteristic curve. FIG. 1B illustrates an example of four characteristic curves C1, C2, C3, and C4 for an extended range VCO. In other words, by changing the load capacitance, a different characteristic curve results, thus extending the range of the VCO. While each of the curves corresponds to a different output frequency range, it is known that capacitor values can be chosen so that there is an overlap of the output frequency range among different curves. It is, however, difficult to choose which of the curves to use when using such an extended range VCO. The present invention, described hereinafter, provides such a methodology.

Further, in a conventional PLL, if one of the curves is currently being used with the VCO in a lock condition, and that lock condition is lost, an efficient, systematic method of determining the most appropriate curve to use to re-establish that lock condition does not exist.

Still furthermore, the divide-by-N circuit 250 described above with reference to FIG. 2 is typically implemented using two different counters. One such implementation of a divide-by-N circuit includes a program counter and a swallow counter. In typical implementations, both the program and swallow counters are clocked by or synchronized to the output of the previous block. As a result, the counters present capacitive loading, which limits the maximum operating speed of the divider.

SUMMARY OF THE INVENTION

It is an object of the present invention to provide a lock detect circuit, and in particular a lock detect circuit that is efficient at MegaHertz reference frequencies and GigaHertz carrier frequencies.

It is another object of the present invention to provide a method of and apparatus for generating a lock detect signal.

It is another object of the present invention to provide a method to systematically obtain a lock condition, including the ability to reacquire lock after a lock condition has existed, and then the lock condition is lost.

It is a further object of the present invention to provide a PLL with a divide-by-N circuit that uses only a single counter and a decoder.

It is a further object of the present invention to provide method of using a divide-by-N circuit that uses only a single counter and different decoders to design different PLLs that have different frequency and/or channel characteristics.

The present invention attains at least the above objects, and others, either singly or in combination, by providing a synthesizer having an efficient lock detect signal generator, an extended range VCO that can operate within any one of a plurality of adjacent characteristic curves defined by a plurality of adjacent regions, and a divide circuit implemented using only a single counter along with a decoder.

This allows for a method of operating the synthesizer, methods of establishing or reestablishing a lock condition using the extended range VCO, and a method of designing a plurality of divide circuits which each use the same single counter and each use a different decoder.

According to one aspect, the present invention provides an apparatus for and a method of generating a lock detect signal indicative of stability of a frequency of an output signal based upon UP and DN signals received from a phase detector. In the apparatus and method, the UP and DN signals are combined, and then delayed, so that the delayed and undelayed combined signals can be operated upon to obtain the lock detect signal.

According to another aspect, the present invention provides a method of establishing a lock condition with a voltage controlled oscillator in which the voltage controlled oscillator can operate within any one of a plurality of adjacent characteristic curves defined by a plurality of adjacent regions. Each characteristic curve has a different capacitance value associated therewith and a lock is established with one of the plurality of characteristic curves, the characteristic curve that is used is one that is chosen to minimize phase noise.

According to another aspect, the present invention provides a method of reestablishing a lock condition in a synthesizer having an extended range voltage controlled oscillator. The extended range voltage controlled oscillator can operate within any one of a plurality of adjacent characteristic curves defined by a plurality of adjacent regions. Each characteristic curve has a different capacitance value associated therewith.

According to yet another aspect, the present invention provides a divide circuit implemented using only a single counter along with a decoder, as well as a method of designing a plurality of divide circuits which each use the same single counter and each use a different decoder.

Advantages of each of the above-recited aspects of the present invention will become apparent in the discussion provided hereinafter.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENTS

The present invention provides a synthesizer for use in communication devices, which, like conventional synthesizers, uses a PLL with a VCO to cause an output signal frequency to vary in dependence upon an input control voltage. Those aspects of the present invention that differ from a conventional synthesizer will accordingly be described hereinafter, with the conventional synthesizer portions not being described in detail.

As mentioned above, it is desirable to generate a lock detect signal indicating that the synthesizer is currently locked on the frequency of interest, and it is of particularly desirable to have such a lock detect circuit that is capable of operating at MegaHertz operating frequencies and Giga-Hertz carrier frequencies.

Figure 3:
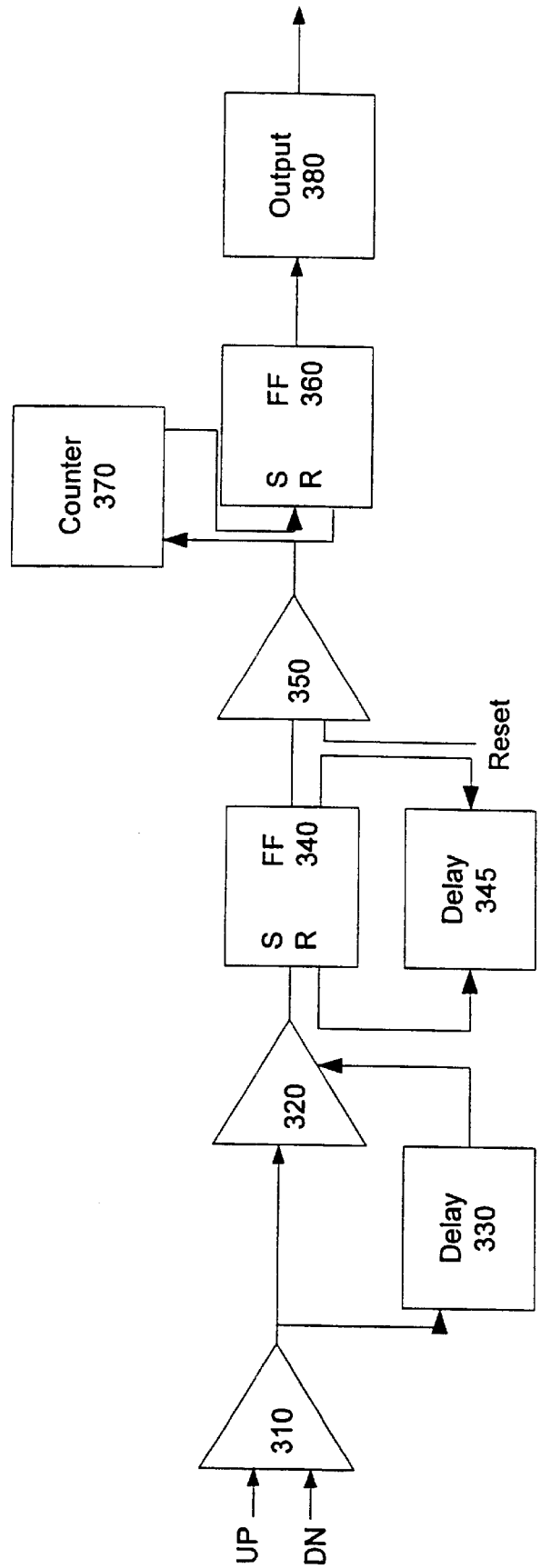
FIG. 3 illustrates a lock detector circuit according to the present invention.

FIG. 3 illustrates a lock detect circuit 300 according to the present invention, which contains an OR gate 310, AND gate 320, and a delay circuit 330. Further advantages can also be obtained from including in the lock detect circuit 300 a flip flop 340, a reset OR gate 350, a latch circuit 360, a counter 370 and a lock output circuit 380.

As shown, both the UP and DN signals are input to the OR gate 310, the output of which is supplied to one input of the AND gate 320 and the delay circuit 330. The delayed output of the OR gate 310 is then input to the other input of the OR gate 320. It is noted that the combination of the OR gate 310 and the AND gate 320 can be implemented using solely NOR or NAND gates, such that the logical result remains the same. The output of the AND gate 320 thus becomes the lock detect signal, with the existence of a "long" pulse, described hereinafter, indicating an out of lock condition, and either no pulse or a "short" pulse, described hereinafter, indicating a lock condition.

Figure 4A:
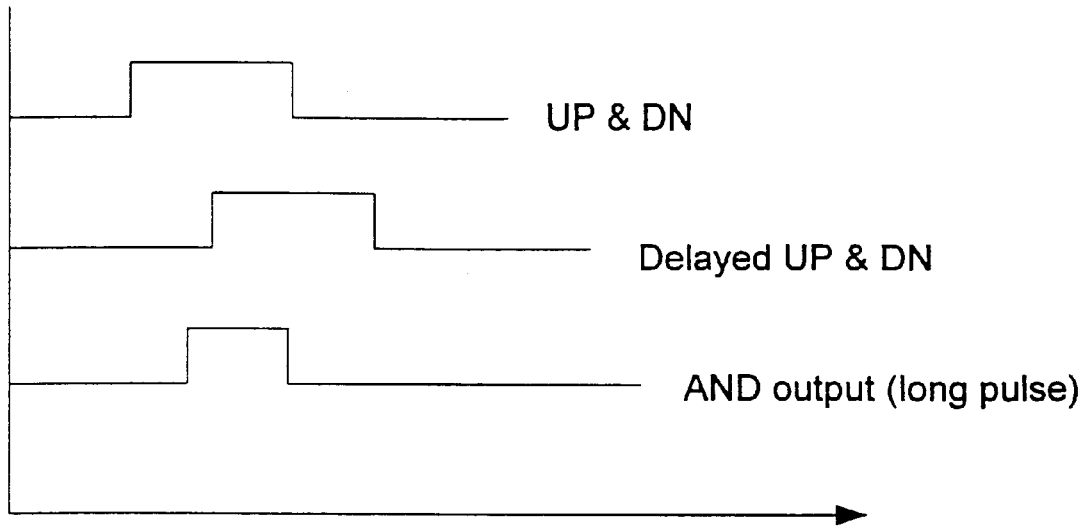
FIGS. 4A–4B illustrate locked and unlocked conditions according to the present invention.
Figure 4B:
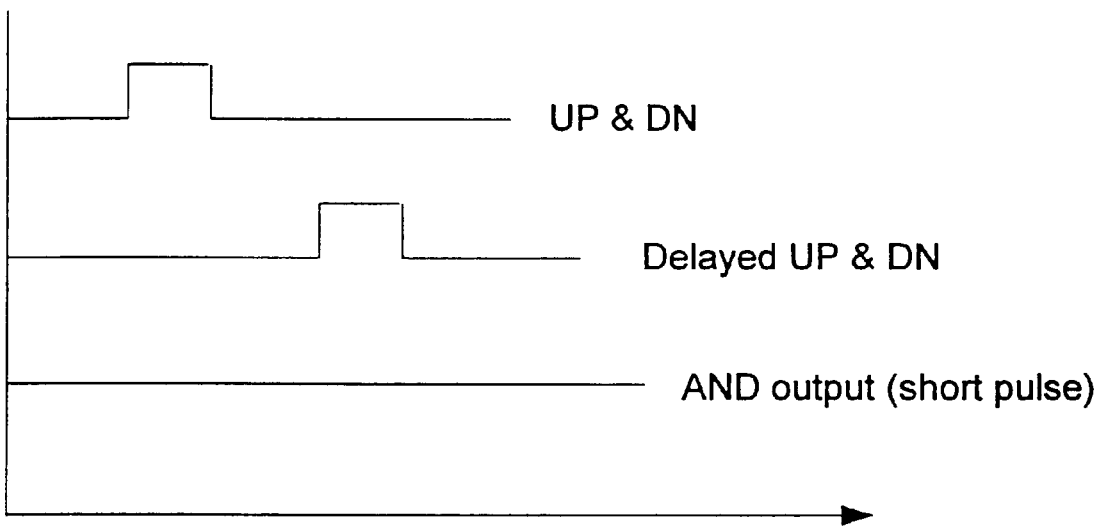

FIG. 4A illustrates an example of the signature of the OR'd UP and DN signals and the delayed OR'd UP and DN signals received at the AND gate 320, that are indicative of an unlocked state and FIG. 4B illustrates the signature in a locked state. Since in an unlocked state one of the UP and DN signals will have a larger pulse duration than the other, the result of the OR gate 310 OR operation is a pulse having a substantial width. As a result, when this signal is delayed, and then subsequently the delayed and non-delayed signals are AND'ed by AND gate 320, the lock detect signal at the output of the AND gate 320 will have a long pulse, thus indicative of the unlocked stated. In a locked state, the lock detect signal will have no pulse or a short pulse, thus indicative of a locked state.

As was mentioned previously, the other components illustrated in FIG. 3 can provide further advantages. The flip flop 340 receives, in sequence, each consecutive lock detect signal output from the AND gate 320, as well as, also in sequence, a signal indicative of the previous state, which has been delayed in a delay circuit 345. The delay of circuit 345 is designed to be longer in time than the minimum duration pulse required to trigger all subsequent circuits with a signal indicating an out-of-lock condition. The flip flop 340 is thus configured so that a received series of short pulses indicative of a locked condition will not trigger the flip flop 340, whereas any received long pulse indicative of an out-of-lock condition will trigger the flip flop 340. The presence of the flip flop 340 will thus advantageously shape the pulses, such that all long pulses will last at least a minimum duration set by delay circuit 345, and short pulses are eliminated. Accordingly, this assists in ensuring that other logic circuits further down the signal path are not corrupted by pulses lower than the setup-hold time of those circuits, which if uncorrected would produce unpredictable results. Thus, false lock and false out-of-lock signals are prevented from occurring.

The reset OR gate 350 is used to reset the lock detect circuit, which will occur when a RESET signal is received.

The latch circuit 360, in a preferred embodiment, is a S-R latch circuit. The latch circuit 360 will become SET, based upon the output from the counter 370, after a certain predetermined number of clock periods elapse without any pulses occurring at the output of gate 350. In the preferred embodiment, eight clock periods without any pulses from gate 350 indicate that a lock condition exists, thereby providing assurances that the output signal frequency is in fact stable. Accordingly, the output from the reset OR gate 350, which represent consecutive lock detect signals, are input into counter 370 as a reset signal. The counter 370 will increment at each consecutive clock pulse signal that is received and will be reset to zero by any reset signal pulse from gate 350. When the count of the counter reaches the predetermined number of clock periods without a reset occurring, a SET signal is generated and applied to the Set input of the latch circuit 360, thus causing an active high state lock detect signal at the output of the latch circuit 360. If, however, a long pulse lock detect signal is received, indicating that a lock condition does not exist, then the counter is zeroed and the predetermined number of clock periods must elapse before the SET signal can be generated.

The latch circuit 360 also receives each lock detect signal that is sent to the counter 370 at its Reset input. Any received long pulse lock detect signal, will cause the latch circuit to reset, thus indicating that a lock condition no longer exists. Accordingly, by resetting the latch, the output of the latch circuit 360 will change from the active high state lock detect signal to an active low state lock detect signal, indicative of a no lock condition.

A high state lock detect signal indicating the presence of lock condition output from the latch circuit 360 is received by the lock output circuit 380, which amplifies and shapes the high state lock detect signal for use by the synthesizer as is conventionally known.

The lock detect circuit described above is particularly efficient. It requires as inputs only the UP and DN signals already present in the synthesizer architecture, and from these signals alone can detect a locked or an unlocked stated. Further, the pure analog elements of this lock detect circuit are limited to delay lines, thus allowing for better repeatability and predictability over temperature and/or other environmental changes due to the relative robustness of the digital latches used. Having described the lock detect circuit, another aspect of the present invention, that of automatically obtaining and maintaining a lock condition in an extended range VCO, will now be described.

Figure 1A:
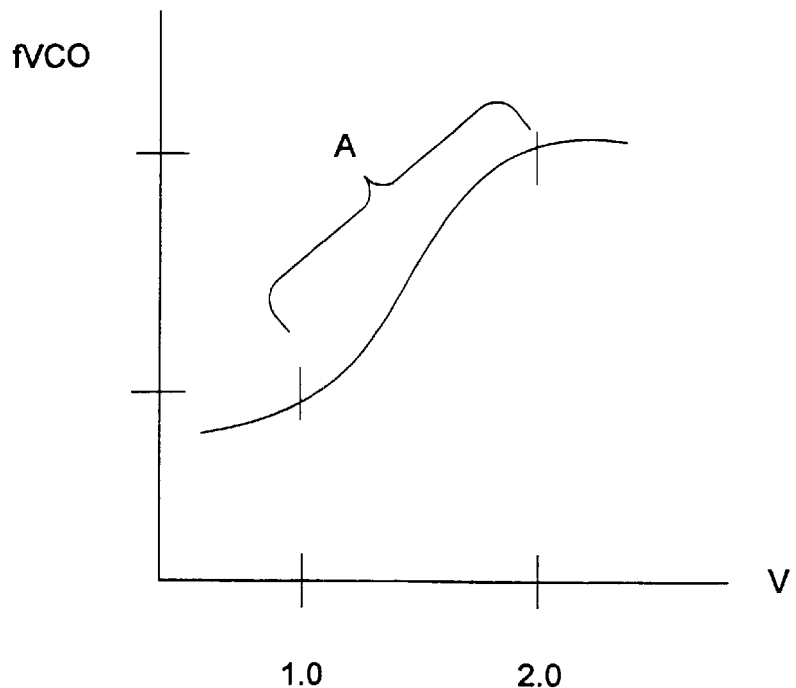
FIG. 1A illustrates the typical characteristic curve identifying the relationship between the control voltage and the output frequency of a VCO.
Figure 1B:
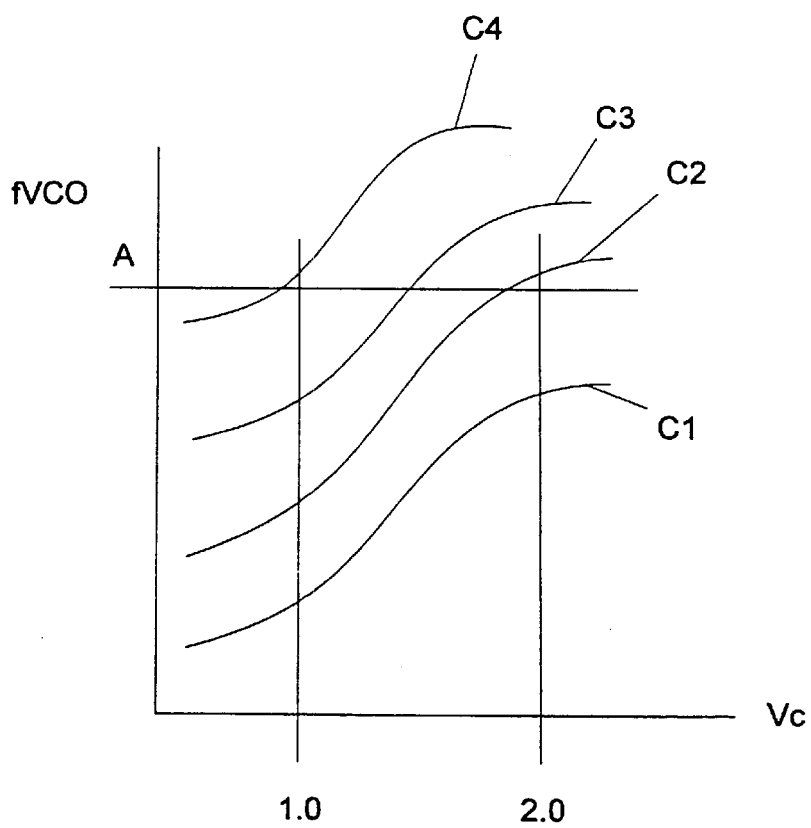
FIG. 1B illustrates a family of characteristic curves representing different output frequencies for the same control voltage value in an extended range VCO.

A conventional VCO that does not have an extended range allows a range of control voltages that exist within a substantially linear region to cause a corresponding range of VCO frequencies, as shown in FIG. 1B and explained above.

In a VCO having an extended range, however, there exists a family of curves, each having a linear region, representing different output frequencies for the same control voltage value. Accordingly, for any desired VCO frequency, there may be more than one curve that will allow attainment of that frequency, and it may well be the case that one of the curves is better suited for use than another of the curves.

For example, referring to FIG. 1B, for the VCO frequency A, and within a control voltage Vc that has some range, such as between 0.1 and 2.2 volts shown in the specific example, it can be seen that operating regions defined by the linear portion of curves C1 and C4 do not allow attainment of this frequency A, whereas operating regions defined by the linear portion of curves C2 and C3 do. It is noted, however, that the control voltage required for the C2 curve to attain frequency A requires a control voltage Vc that is close to the upper limit of the control voltage range. Similarly, if the control voltage is close to the lower limit, the same considerations apply.

Further, where proximity to the range limit is not an issue, but there are still more than one curve can both be used to attain the desired VCO frequency, and with other considerations being equal, it has been recognized that in this preferred embodiment it is desirable to use that curve which will minimize phase noise. In the preferred embodiment, phase noise can be minimized by maximizing the control voltage, Vc. Thus, using that curve which will have a higher control voltage will minimize phase noise. Circuits can also be designed such that the phase noise can be minimized by using minimizing the control voltage, Vc, which is intended as being within the scope of the present invention. Accordingly, for such an implementation, using that curve which will have a lower control voltage will minimize phase noise.

In order to automatically cause the implementation of the above-mentioned considerations in a system that provides for the automatic obtaining and maintaining of a lock condition in an extended range, the features described with respect to FIGS. 5 and 6 hereinafter can be implemented.

Figure 5:
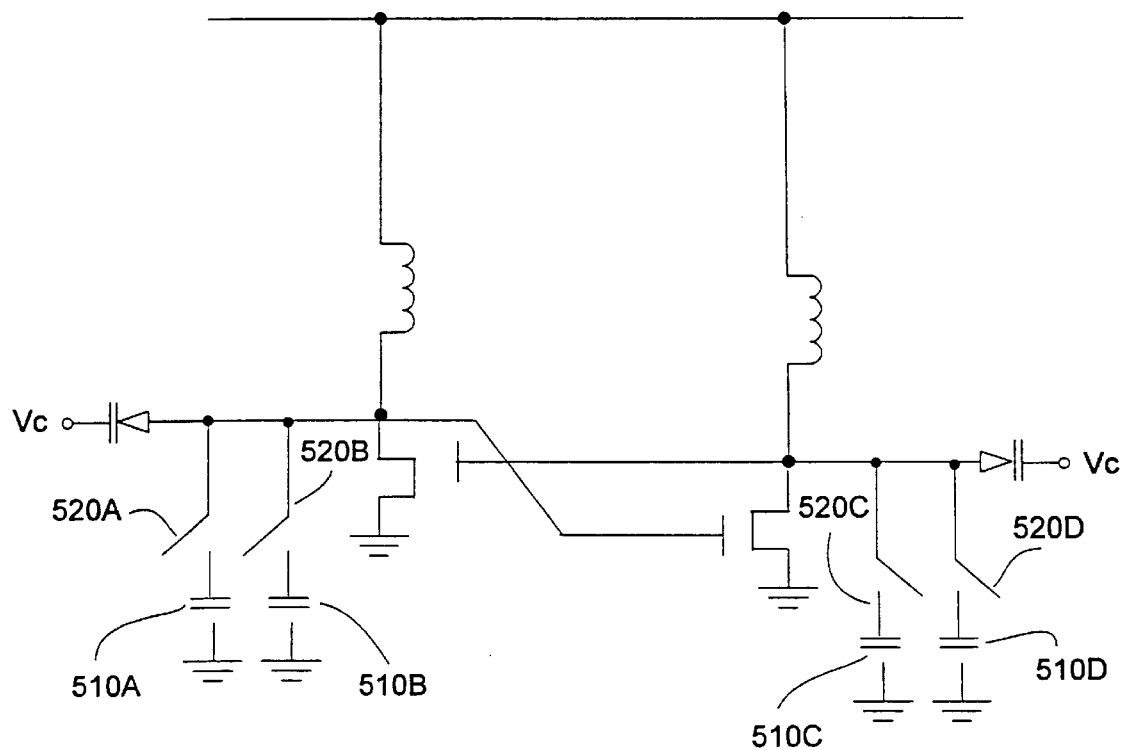
FIG. 5 illustrates a portion of the VCO that is used to obtain the family of curves illustrated in FIG. 1B according to the present invention.

FIG. 5 illustrates a portion of the VCO circuit 500 that can cause generation of each of the different family of curves, such as illustrated in FIG. 1B. In particular, each of the capacitors 510A–D can be made part of the circuit by switching the corresponding switch 520A–D. The value of the capacitors are not equal, and, therefore, with four capacitors, it will be appreciated that 16 different combinations of capacitance values can be achieved, depending upon which of the switches 520 is open and which of the switches 520 is closed. This provides 16 different curves. In the preferred embodiment, the position of each of the switches 520 is determined by the state of the bits in the capacitor register (not shown), which is used to keep track of the present configuration of each of the switches.

Figure 6A:
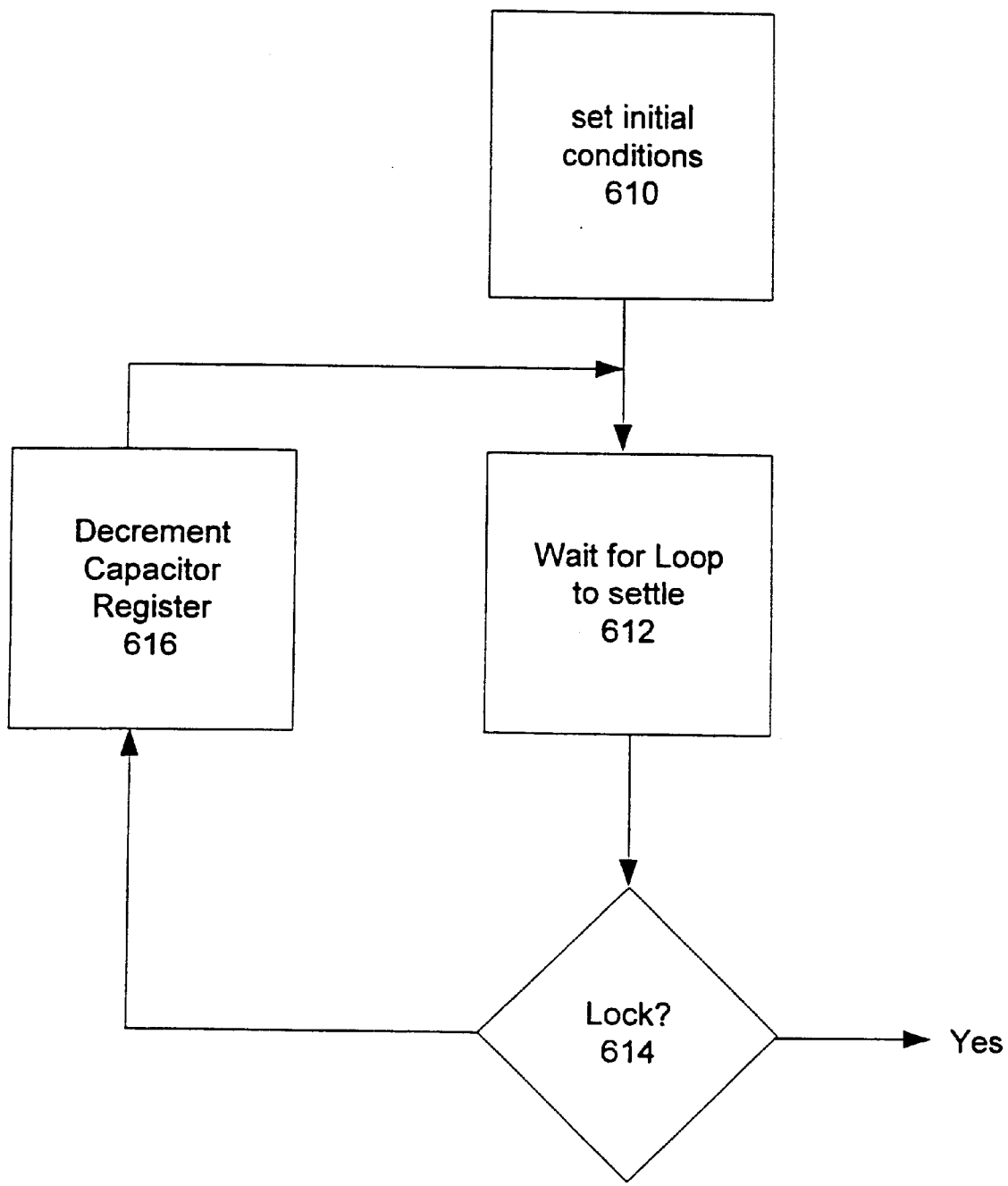
FIGS. 6A–6C illustrate flow charts of how an optimal lock condition is established and maintained both initially, as well as after a previously established lock condition is lost, according to the present invention.

The manner in which a lock condition is established and maintained is controlled by a state machine that controls the steps illustrated by FIGS. 6A–6C hereinafter. Initially, the VCO will not be locked and an initial search must be made for the most appropriate curve in the family of curves, as well as the most appropriate control voltage Vc for that curve. In the initial state, the capacitor register is set so that the circuit 500 has the highest capacitance associated with it, such that all of the switches 520 are closed, and the highest curve of the curves, such as curve C4 illustrated in FIG. 1B, will be used. This setting of initial conditions illustrated as step 610 in FIG. 6A.

Step 612 follows, the feedback mechanism of the synthesizer adjusts the control voltage to potentially obtain lock.

After waiting for the synthesizer loop to settle, the state machine checks to see if lock has been achieved, as illustrated by step 614. If lock has not been achieved, the capacitor register is decremented, as shown by step 616. It is noted that within a given characteristic curve, a control voltage that achieves lock is needed. The manner in which the control voltage is chosen, given a particular curve, is conventional in PLL circuits, and need not, therefore, be further discussed.

The update of the capacitor register will cause the VCO 500 to operate at a point indicated by the next level lower curve, such as curve C3 illustrated in FIG. 1B. Thereafter, step 612 and steps thereafter, as described herein, then follow, which check for a lock condition at that curve. If a lock condition is not reached at any given curve, then the next lower curve is then checked. This process repeats until a lock condition is found. If no lock condition is found, however, this indicates that some other condition may exist preventing lock. While the entire process can be repeated, conventional system diagnostics can be used to determine if there is some other reason that lock has not occurred. During the checking for a lock condition as described above, the control voltage Vc is constrained to a predetermined range, shown for instance as the range of 0.1 to 2.2 volts in FIGS. 1A and 1B.

Figure 6B:
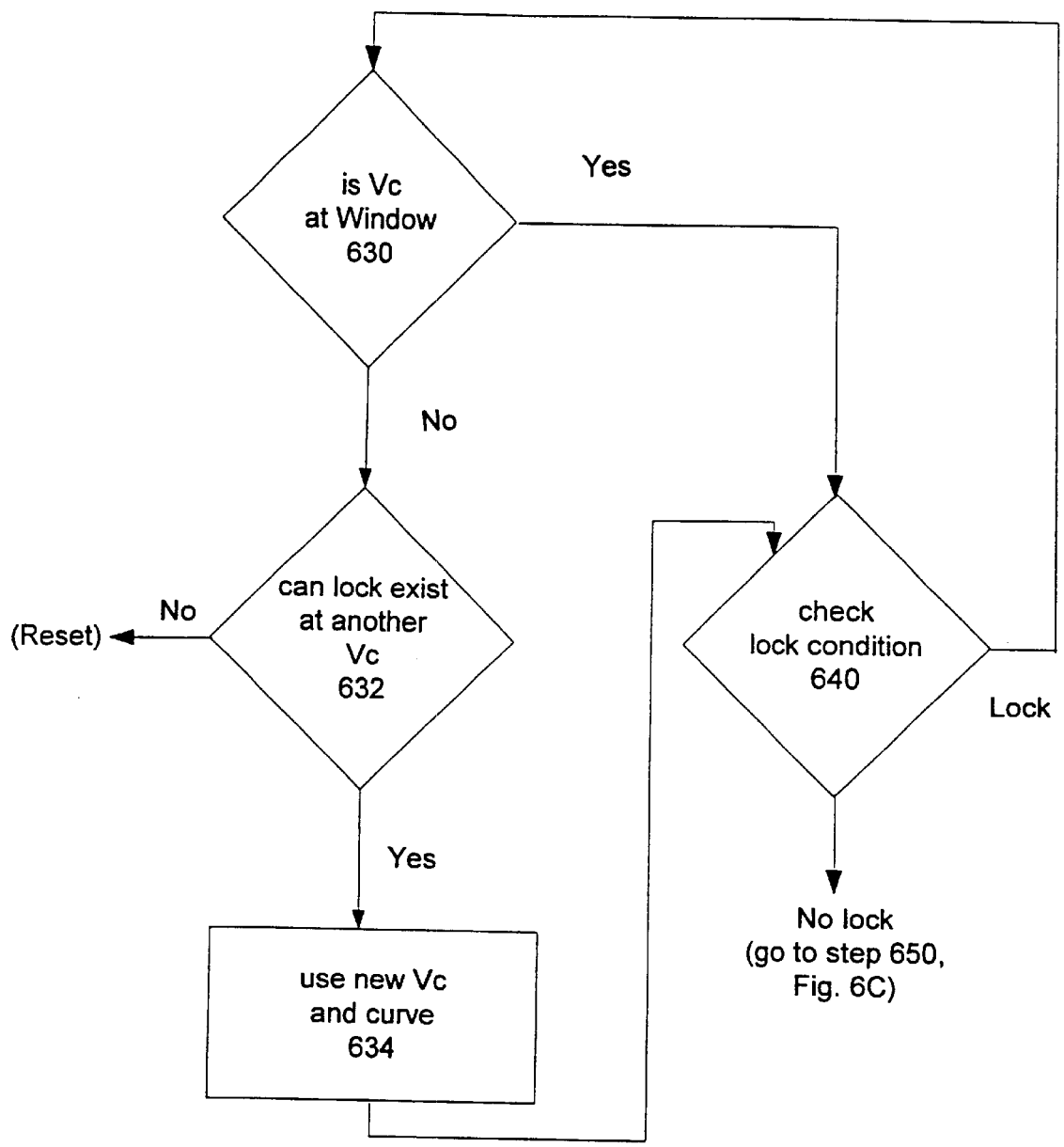
Figure 6C:
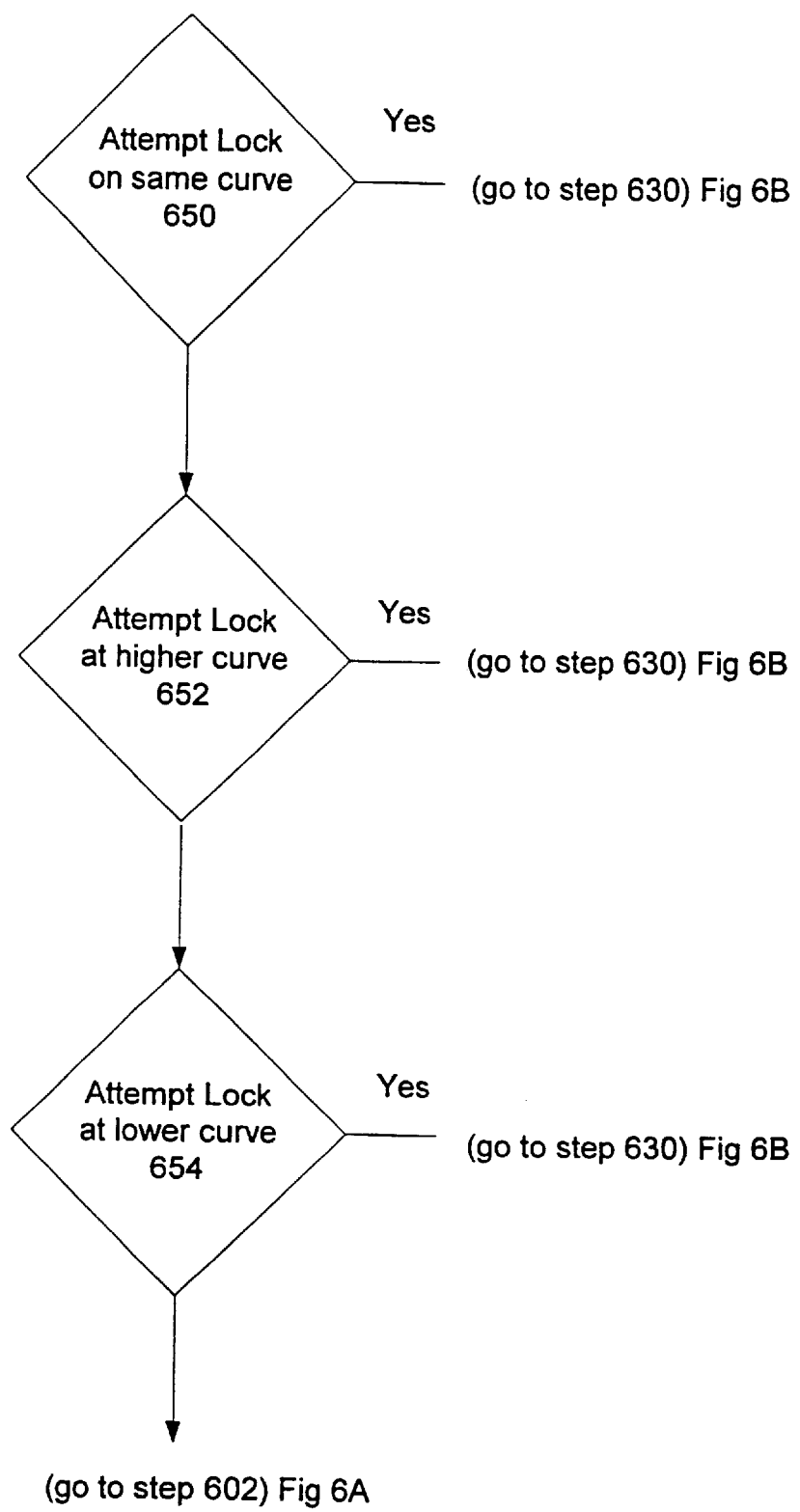

If a lock condition results after step 614, then step 630, shown in FIG. 6B, follows, in which the value of the control voltage Vc can be checked. In particular, if the value is beyond some window of the upper and lower limits of the range that the control voltage should take, then step 632 follows in which a determination is made whether a lock condition can exist at another control voltage, on a different curve, that still results in a lock condition and is not beyond any such window.

The steps used in making that determination are the same as the steps used in reacquiring a lock condition after lock has been lost, as described hereinafter. If a lock condition can exist at another curve voltage, then step 634 is followed and that new position (of both the curve and the control voltage) is used during operation. Since the VCO is designed with overlapping characteristic control voltage curves, this ensures that a lock condition within the range will exist.

Using the control voltage check as described above, the most appropriate control voltage can be used. After the control voltage check, then step 640 follows in which the control system is idled and the lock condition monitored through the UP and DN signals using the lock detect circuit previously discussed. Further, it is noted that it may be desirable to check for a lock condition more frequently than checking the control voltage, since checking for the control voltage requires strobing the comparator, which undesirably will cause excess power consumption.

If, after a lock condition exists, that lock condition is then lost, the steps as described hereinafter occur. Specifically, at step 650, shown in FIG. 6C, the range of control voltages for the curve that was being used at the time the lock condition was lost is checked to determine whether a lock condition can be reestablished by the state machine and PLL after a fixed duration of time, which duration can vary according to design requirements. If lock is not established in step 650, then in step 652 the next lowest curve is checked. Thus, with reference to FIG. 1B for example, if curve C3 had been being used, then curve C2 will be checked to determine if a lock condition can be established using that configuration of the capacitors 510 by appropriately setting switches 520. The control voltages can be checked as described above. If lock is not established in step 652, then in step 654 that curve which is one higher than the curve being used when the lock condition was lost. Thus, with reference to FIG. 1B for example, if curve C3 had been being used, then curve C4 will be checked to determine if a lock condition can be established using that configuration of the capacitors 510 by appropriately setting switches 520. As with step 650, in step 652 the control voltages can be checked as described above.

While the sequence described above checks curves that are lower than the curve used when lock was lost, in alternative embodiments the curve that is one higher than the curve that was being used when the lock condition was lost checked in step 652 can be checked, or a plurality of curves that are adjacent to the curve that was being used when the lock condition was lost can be checked. While there are advantages to using one of the higher curves that will have, on average, a higher control voltage and therefore a lower phase noise, the search strategy should maximize the time it takes to re-obtain lock, which typically be as likely to have been lost to a lower curve than to a higher curve. Accordingly, the present invention checks the adjacent curves, arbitrarily starting with the lower one.

If lock is established in either of steps 650 or 652, then step 630 from FIG. 6B follows, as described above.

In the preferred embodiment, if lock is still not established in step 652, then lock is attempted by setting the capacitor register to the initial state, as described previously in step 602, and attempting to re-establish lock as if lock had not been previously established. It is understood, however, that other adjacent curves could be searched before setting the capacitor register to the initial state.

Figure 2:
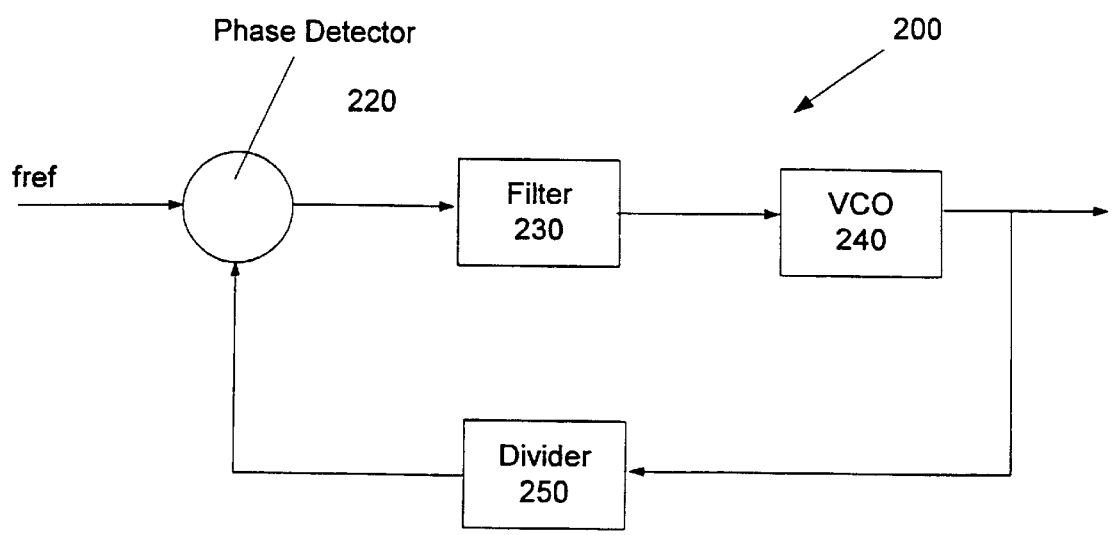
FIG. 2 illustrates a conventional PLL circuit that uses a VCO to generate an output signal that is synchronized to a reference signal.
Figure 7:
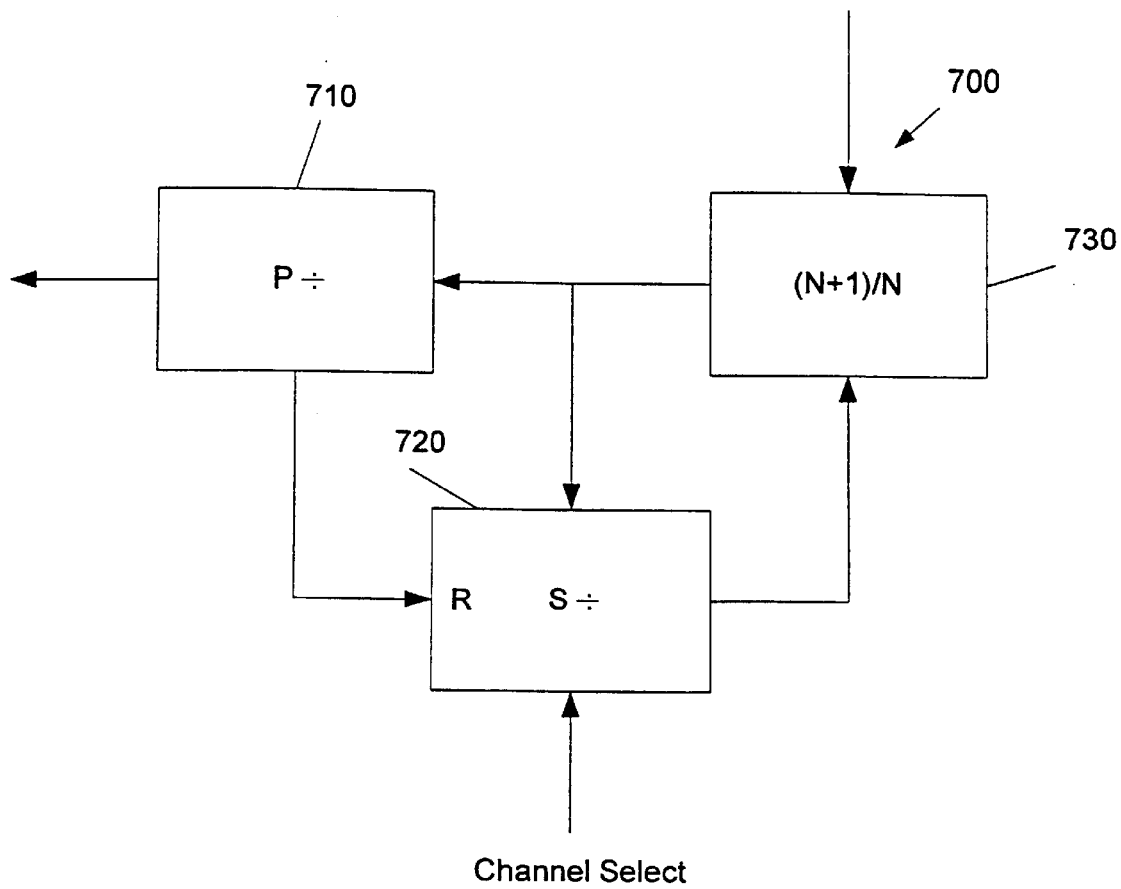
FIG. 7 illustrates a conventional programmable divider used in the feedback path of a phase locked loop that uses multiple counters.

It is another aspect of the present invention to provide a PLL with a divide-by-M circuit that uses only a single counter. FIG. 7 illustrates a conventional programmable divider 700 as the specific divider that forms the divide-by-N circuit 250 illustrated in FIG. 2 and which uses multiple counters. In this implementation, the output frequency is divided by some integer value "M" to obtain the feedback signal, and the division operation is broken up into successive stages. The division operation is broken into successive stages in order to accommodate the existence of different desires output frequencies for different channels. In particular, it is known that the correct divisor can be obtained from the equation:

$$M=NP+S \qquad (1)$$

where P is a predetermined integer value, N is another predetermined integer value, and S is a range of integer values, such that the highest value of S is less than the value of P. In an example, if PLL is to have 6 channels, the divisor ratio of each of the channels could be, for example, 260, 261, 262, 263, 264 and 265 for each of the respective channels. This divisor ratio can be achieved, for example using an N*P product of 256 and a range of S that is 4–9, such that 256+4=260; 256+5=261 and so on.

In such a conventional circuit the program counter 710 counts the P pulses, and the swallow counter 720 counts the S pulses. There is also included a dual-modulus prescalar 730 that will divide the output frequency by (N+1) until the swallow counter 720 overflows, and by N after the program counter 710 overflows. While this approach will work, it requires the implementation of a new swallow counter for each different design, which different design may have, for example, a different number of channels, different frequencies or the like. This disadvantage is eliminated in the present invention. Since the present invention uses a single counter, as will be described hereinafter, for a new design, there is required only a new decoder for the specific implementation, but the other circuit elements remain unchanged. Further, the present invention, since it employs only a single counter, eliminates half of the capacitive loading that exists in the conventional circuit by employing one counter and a decoder. Further, when different PLL characteristics are required for a different circuit, such as channel or frequency, the conventional circuit will require the swallow counter to be modified and hence affect the maximum operating speed performance, In contrast, the present invention will only require modification of the decoder, which will not have an effect on the maximum operating speed.

Figure 8A:
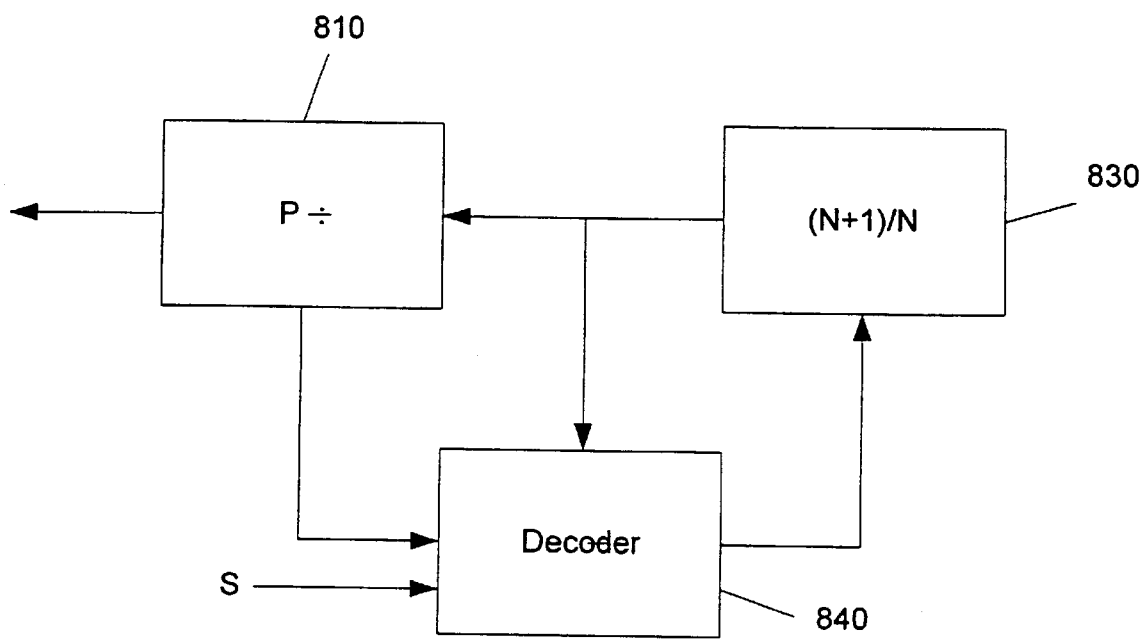
FIGS. 8A–8C illustrate programmable dividers used in the feedback path of a phase locked loop according to the present invention that uses a single counter and a decoder.

As shown in FIG. 8A, in the present invention, rather than using a swallow counter, a decoder is used instead. Accordingly, there is included a program counter 810 counts the P pulses, a dual-modulus prescalar 830 that will divide the output frequency by either (N+1) or (N) as described above, and a decoder 840 that is preferably implemented using either a comparator or a combination of a detectors and S-R flip flops.

Figure 8B:
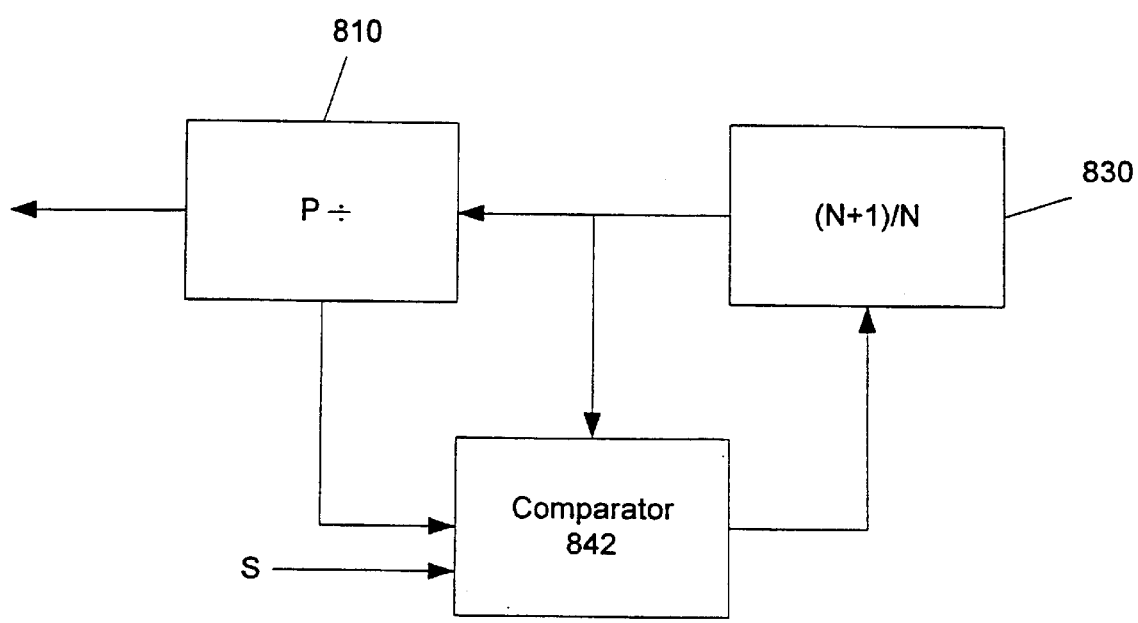

When implemented as a comparator, as shown in FIG. 8B, each time the P counter 810 increments, that value is compared to the current S value. If P>S, then the comparator 842 will output a comparator signal having a high state, and thus causing the dual-modulus prescalar 830 to divide the output frequency by (N+1), whereas if P<S, then the comparator 842 can output a comparator signal having a low state, and thus causing the dual-modulus prescalar 830 to divide the output frequency by (N).

Figure 8C:
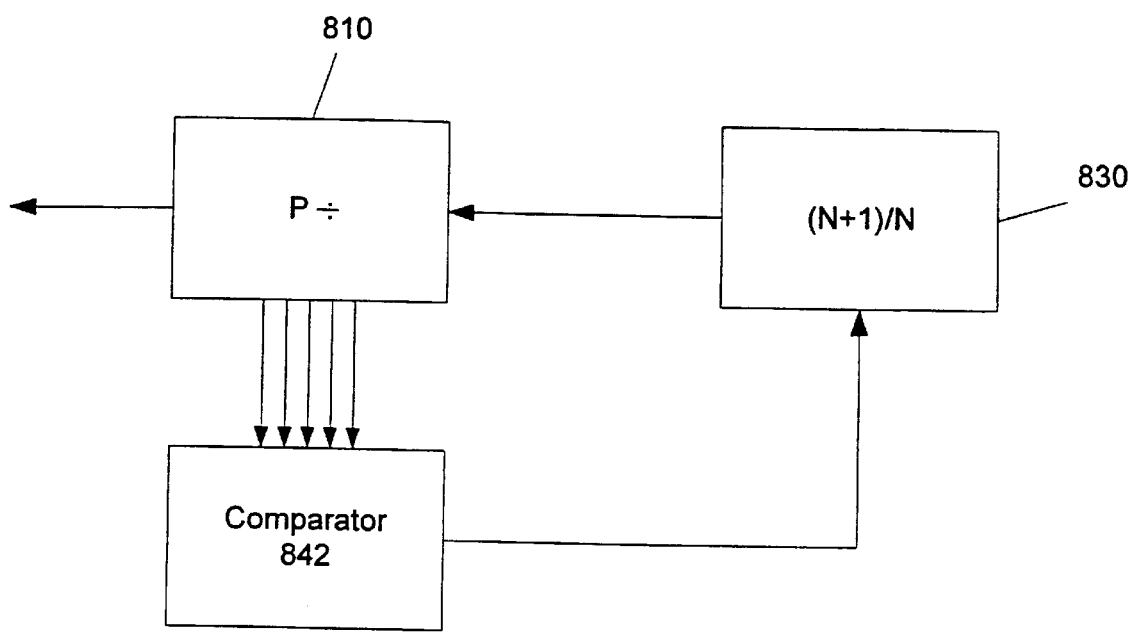

Alternatively, when implemented as detectors and S-R flip flops, as shown in FIG. 8C, each S value can be detected by the detector 844, such that a high state signal is created when Sn=P (where n will be a range, such as 4–9 in the example provided above). When the pulse is created, that will cause an associated S-R flip flop 846 to reset, and thereby cause the dual-modulus prescalar 830 to change from dividing by (N+1) to (N) or vice versa.

Although the present invention has been described in detail with reference to the preferred embodiments thereof, those skilled in the art will appreciate that various substitutions and modifications can be made to the examples described herein while remaining within the spirit and scope of the invention as defined in the appended claims.

We claim:

1. A method of generating a lock detect signal indicative of stability of a frequency of an output signal based upon UP and DN signals received from a phase detector comprising the steps of:

receiving the UP and DN signals from the phase detector;

performing a first operation that combines the received UP and DN signals to obtained a combined signal;

delaying the combined signal to obtain a delayed combined signal;

performing a second operation on the combined signal and the delayed combined signal to obtain the lock detect signal.

2. A method according to claim 1 wherein the first operation is an OR operation and the second operation is an AND operation.

3. A method according to claim 1 wherein each of the first and second operations are implemented using NOR gates.

4. A method according to claim 1 wherein each the first and second operations are implemented using NAND gates.

5. A method according to claim 1 further including the step of shaping the lock detect signal to provide a lock detect pulse of sufficient duration to trigger all other downstream circuits.

6. A method according to claim 5 wherein any pulse that has a width less than a predetermined pulse width is eliminated.

7. A method according to claim 1 further including the step of counting a plurality of clock periods during which a lock condition exists to ensure stability of the output signal.

8. A method according to claim 7 wherein the step of counting the plurality of clock periods counts eight clock periods.

9. An apparatus for generating a lock detect signal indicative of stability of a frequency of an output signal based upon UP and DN signals received from a phase detector comprising:

an input that receives the UP and DN signals;

a first circuit that combines the received UP and DN signals to obtain a combined signal;

a delay stage that operates upon the combined signal to obtain a delayed combined signal;

a second circuit that operates upon the combined signal and the delayed combined signal to obtain the lock detect signal.

10. An apparatus according to claim 9 wherein the first circuit performs an OR operation and the second circuit performs an AND operation.

11. An apparatus according to claim 9 wherein each of the first and second circuits include a NOR gate.

12. An apparatus according to claim 9 wherein each the first and second circuits are implemented using NAND gates.

13. An apparatus according to claim 9 further including a flip flop that receives and shapes the lock detect signal.

14. An apparatus according to claim 13 further including a counter for counting a plurality of clock periods during which a lock condition exists.

* * * * *

UNITED STATES PATENT AND TRADEMARK OFFICE
CERTIFICATE OF CORRECTION

PATENT NO.    : 6,570,453 B2
DATED         : May 27, 2003
INVENTOR(S)   : David K. Su et al.

It is certified that error appears in the above-identified patent and that said Letters Patent is hereby corrected as shown below:

<u>Title page,</u>
Item [75], Inventors, replace "Masound Zargari" with -- Masoud Zargari --.

Signed and Sealed this

Twenty-first Day of June, 2005

JON W. DUDAS
*Director of the United States Patent and Trademark Office*